(12) United States Patent
Singh et al.

(10) Patent No.: US 9,506,826 B2
(45) Date of Patent: Nov. 29, 2016

(54) OPEN LOOP LOAD FORCE ESTIMATION SYSTEMS AND METHODS

(71) Applicant: GOODRICH CORPORATION, Charlotte, NC (US)

(72) Inventors: Sameep Singh, Beavercreek, OH (US); Richard Kolk, Louisville, KY (US)

(73) Assignee: GOODRICH CORPORATION, Charlotte, NC (US)

( * ) Notice: Subject to any disclaimer, the term of this patent is extended or adjusted under 35 U.S.C. 154(b) by 137 days.

(21) Appl. No.: 14/564,545

(22) Filed: Dec. 9, 2014

(65) Prior Publication Data

US 2016/0161351 A1  Jun. 9, 2016

(51) Int. Cl.
*G01L 1/00* (2006.01)
*G01L 5/22* (2006.01)
*G01R 19/00* (2006.01)

(52) U.S. Cl.
CPC ........... *G01L 5/225* (2013.01); *G01R 19/0092* (2013.01)

(58) Field of Classification Search
CPC ..... G01L 5/225; G01L 5/28; G01R 19/0092; B60T 13/741; B60T 8/3255; B60T 7/042; F16D 2066/006; F16D 2066/003; F16D 2066/005
USPC ............ 73/126, 862.68; 701/70–72; 303/155
See application file for complete search history.

(56) References Cited

U.S. PATENT DOCUMENTS

| | | | |
|---|---|---|---|
| 4,577,497 A * | 3/1986 | Ray | G01M 17/0072 73/126 |
| 6,345,225 B1 | 2/2002 | Bohm et al. | |
| 7,353,101 B2 | 4/2008 | Phillips | |
| 7,424,937 B2 | 9/2008 | Henry et al. | |
| 8,315,771 B2 * | 11/2012 | Baumgartner | B60T 13/741 188/196 V |
| 8,393,203 B2 * | 3/2013 | Cahill | B60T 17/221 73/121 |
| 2003/0150677 A1 * | 8/2003 | Maron | B60T 13/741 188/158 |
| 2006/0108867 A1 | 5/2006 | Ralea | |
| 2006/0195246 A1 | 8/2006 | Thibault | |
| 2007/0282511 A1 | 12/2007 | Henry | |
| 2010/0292889 A1 * | 11/2010 | Cahill | B60T 8/1703 701/29.1 |
| 2016/0161352 A1 | 6/2016 | Singh et al. | |

FOREIGN PATENT DOCUMENTS

| | | |
|---|---|---|
| EP | 1661780 | 5/2006 |
| EP | 1746339 | 1/2007 |
| EP | 1826081 | 8/2007 |

(Continued)

OTHER PUBLICATIONS

Preinterview First Office Action dated Jul. 29, 2016 in U.S. Appl. No. 14/564,558.

(Continued)

*Primary Examiner* — Lisa Caputo
*Assistant Examiner* — Brandi Hopkins
(74) *Attorney, Agent, or Firm* — Snell & Wilmer LLP (57) ABSTRACT

What is described is a system for determining a force applied to an outer disc of an aircraft brake by an actuator motor. The system includes a current sensor coupled to the actuator motor and configured to detect an amount of current applied to the actuator motor. The system also includes a controller coupled to the current sensor. The controller is configured to determine an estimate of the force applied to the outer disc based on the detected amount of current and predetermined input parameters.

14 Claims, 8 Drawing Sheets

(56) References Cited

FOREIGN PATENT DOCUMENTS

| EP | 2463166 | 6/2012 | | |
|---|---|---|---|---|
| EP | 2615005 | 7/2013 | | |
| GB | 2469703 | 10/2010 | | |
| JP | 2010203561 | 9/2010 | | |
| WO | 9850711 | 11/1998 | | |
| WO | 0145245 | 6/2001 | | |
| WO | WO 0145245 A1 * | 6/2001 | ............. | B60T 7/042 |
| WO | 2007120267 | 10/2007 | | |
| WO | 2014135947 | 9/2014 | | |

OTHER PUBLICATIONS

Extended European Search Report dated Apr. 25, 2016 in European Application No. 15198705.4.
Extended European Search Report dated May 17, 2016 in European Application No. 15198632.0.

* cited by examiner

OPEN LOOP LOAD FORCE ESTIMATION SYSTEMS AND METHODS

FIELD

The present disclosure relates to aircraft brakes, and more particularly, to a system for determining a braking force applied to an outer disc of an aircraft brake.

BACKGROUND

Aircraft brakes include alternating stators and rotating discs that rotate about an axis. Wheels of the aircraft are coupled to the rotating discs. The stators and rotating discs are axially enclosed by two outer discs. In order to cause the rotating discs to slow down or stop rotating (i.e., brake), force is applied to at least one of the outer discs, forcing the outer discs, the stators and the rotating discs together. When forced together, friction reduces the angular speed of the rotating discs.

A motor converts electrical energy into mechanical energy that causes the force to be applied to the outer disc using an actuator. It is desirable to determine the amount of force applied to the outer disc. An actuator may include a force sensor to determine this amount of force.

SUMMARY

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

In accordance with various embodiments, a system for determining a force applied to an outer disc of an aircraft brake by an actuator is disclosed. The system includes a current sensor coupled to the actuator and configured to detect a detected amount of current applied to the actuator. The system also includes a controller coupled to the current sensor and configured to determine an estimate of the force applied to the outer disc based on the detected amount of current and a plurality of predetermined input parameters.

Also disclosed is an exemplary method for determining a force applied to an outer disc of an aircraft brake by an actuator. The method includes receiving, at a controller and by a current sensor, a detected amount of current applied to the actuator. The method also includes receiving, at the controller, the detected amount of current and input parameters including a maximum force of the actuator, a maximum current of the actuator and an efficiency fraction of the actuator. The method also includes determining, by the processor, a mode of operation of the actuator. The mode of operation may include a first mode indicating that the force applied to the outer disc increases proportionally as the amount of current applied to the actuator increases, a second mode indicating that the force applied to the outer disc remains substantially constant as the amount of current applied to the actuator decreases a first amount and a third mode indicating that the force applied to the outer disc decreases proportionally as the amount of current applied to the actuator decreases a second amount. The method also includes determining, by the processor, an estimated amount of force applied to the outer disc of the aircraft brake by the actuator based on the input parameters and the detected amount of current.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration and their best mode. While these exemplary embodiments are described in sufficient detail to enable those skilled in the art to practice the disclosure, it should be understood that other embodiments may be realized and that logical, chemical, and mechanical changes may be made without departing from the spirit and scope of the disclosure. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

Figure 1:
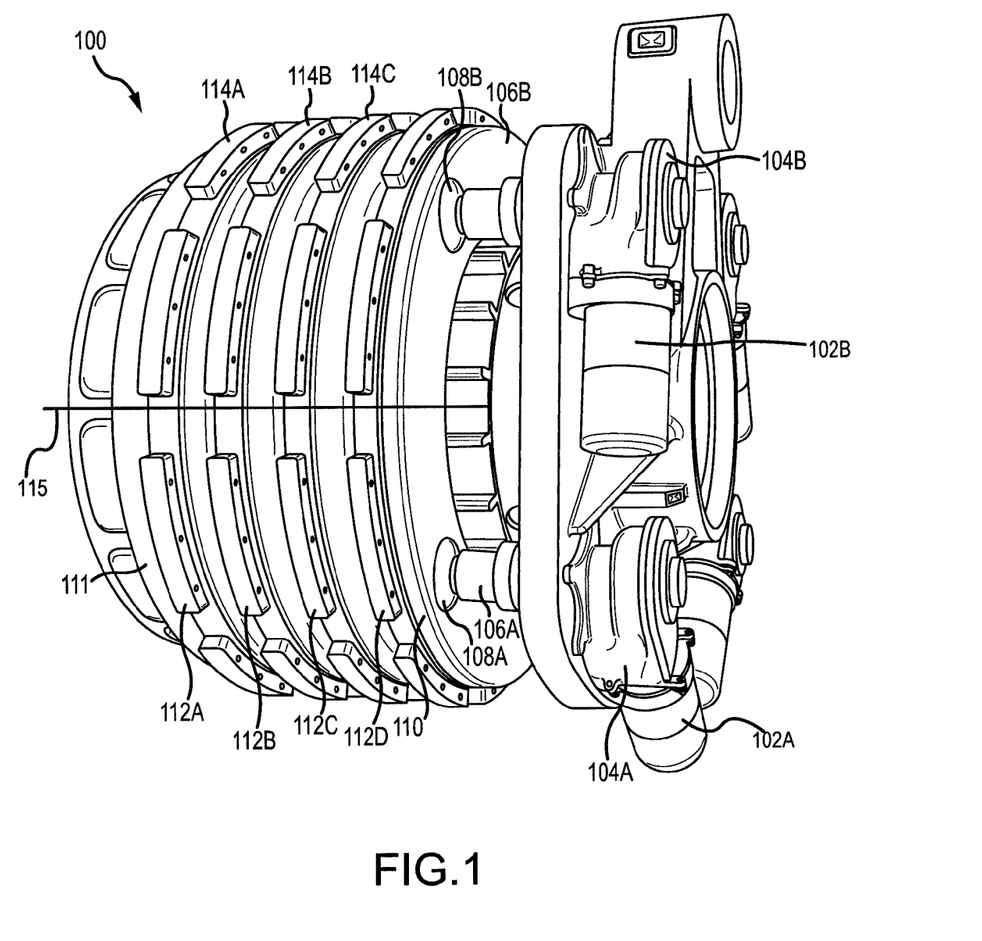
FIG. 1 illustrates an aircraft brake in accordance with various embodiments.

FIG. 1 illustrates an aircraft brake 100 in accordance with various embodiments. Aircraft brake 100 includes a plurality of actuator motors 102A, 102B, a plurality of electromechanical brake actuators 104A, 104B, a plurality of ball nuts 106A, 106B, a plurality of pucks 108A, 108B, an outer disc 111 and an outer disc 110, and a plurality of rotating discs 112A, 112B, 112C, 112D and stators 114A, 114B, 114C positioned in an alternating fashion between outer disc 111 and outer disc 110. Rotating discs 112A, 112B, 112C, 112D may rotate about an axis 115 and the stators 114A, 114B, 114C may have no angular movement relative to axis 115. Wheels may be coupled to rotating discs 112A, 112B, 112C, 112D such that a linear speed of the aircraft is proportional to the angular speed of rotating discs 112A, 112B, 112C, 112D. As force is applied to outer disc 110 towards outer disc 111 along the axis of rotation 115, rotating discs 112 and stators 114 are forced together in an axial direction. This causes the rotational speed of rotating discs 112A, 112B, 112C, 112D to become reduced (i.e., causes braking effect) due to friction between rotating discs 112A, 112B, 112C, 112D, stators 114A, 114B, 114C, outer disc 111 and outer disc 110. When sufficient force is exerted on rotating discs 112 via outer disc 110, the rotating discs 112A, 112B, 112C, 112D will stop rotating.

In order to exert this force onto outer disc 110, actuator motor 102A may cause corresponding electromechanical brake actuators 104A to actuate. Actuator motor 102A may be a brushless motor, such as a permanent magnet synchronous motor (PMSM), a permanent-magnet motor (PMM) or the like. When electromechanical brake actuator 104A actuates, it causes ball nut 106A to extend towards outer disc 110, thus applying force on outer disc 110 towards outer disc 111. Puck 108A is positioned between ball nut 106A and outer disc 110. Puck 108A may be constructed of a softer and/or more compliant material than ball nut 106A such that when ball nut 106A is forced towards outer disc 110, puck 108A prevents outer disc 110 from becoming damaged.

Electromechanical brake actuator 104A is actuated in response to current being applied to actuator motor 102A. The amount of force applied by electromechanical brake actuator 104A is related to the amount of current applied to actuator motor 102A. It is desirable to determine this amount of force. One way to determine this force is to use a force sensor within aircraft brake 100. However, it may be desirable to determine this force without the use of a force sensor.

Aircraft brake 100 may include a current sensor (such as current sensor 208 of FIG. 2) to detect an amount of current provided to actuator motor 102A. Because the amount of force applied by electromechanical brake actuator 104A is related to the current applied to actuator motor 102A, it is possible to estimate the force using the detected amount of current. Thus, a controller or processor may receive the detected current and estimate a force based on the detected current.

Figure 2:
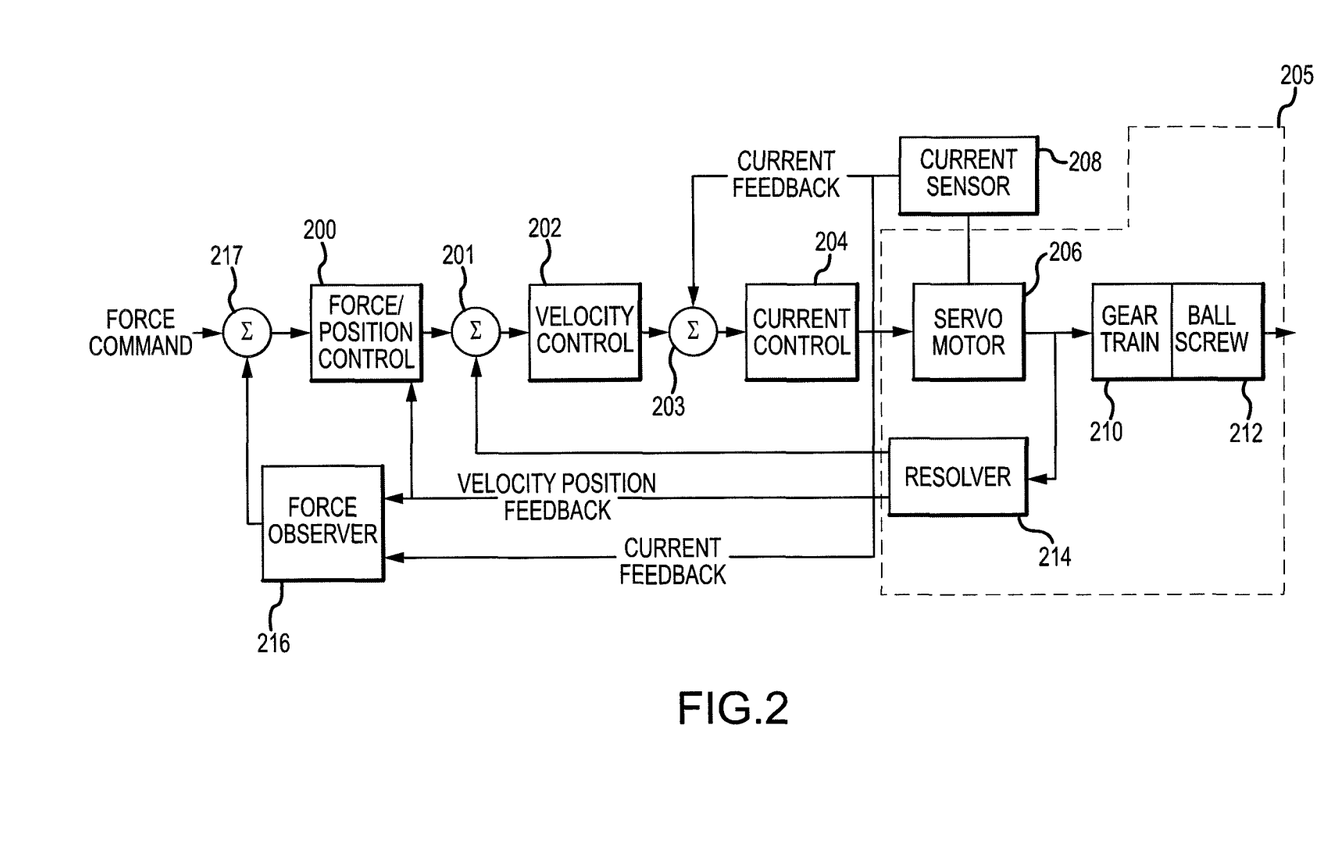
FIG. 2 illustrates a block diagram of an electromechanical brake actuator control system, in accordance with various embodiments.

FIG. 2 illustrates a block diagram of an aircraft electromechanical brake actuator control system in accordance with various embodiments. Block 205 includes mechanical components. The other blocks may be implemented on one or more controllers and/or processors. For example, the blocks other than block 205 may be stored in a non-transitory storage medium and performed by a processor, may be stored in a special-use processor, may be implemented in a field programmable gate array (FPGA), or the like. A current sensor 208 is coupled to an actuator motor 206 (similar to actuator motor 102A). Current sensor 208 is configured to detect an amount of current supplied to actuator motor 206. A resolver 214 is also coupled to actuator motor 206. Resolver 214 measures the rotational position and speed of actuator motor 206. Actuator motor 206 is also coupled to a gear transmission 210 and a ball screw 212.

A force observer module 216 is coupled to block 205. Force observer module 216 is configured to estimate the force of actuator 104A based on data from current sensor 208 and/or resolver 214. Force observer module 216 may be a controller and/or processor or may be implemented in a controller and/or processor.

In block 217, the estimated force is compared with a force command signal. The output of block 217 is provided to a force/position control module 200. Output from force/position control module 200 is summed with the rotational speed of actuator motor 206 in block 201. The result of the summation in block 201 is provided to a velocity control module 202. The output from velocity control module 202 is summed with the detected current from current sensor 208 in block 203. The output from block 203 is provided to a current control module 204. The output of current control module 204 is provided to actuator motor 206 as a control signal.

FIGS. 3A through 3E illustrate logic within force observer module 216 in accordance with various embodiments. The logic may be implemented in hardware and/or software. In various embodiments, the logic may be stored as machine-readable instructions on a non-transitory memory and performed by a processor. In various embodiments, the logic may be stored on a special-use processor or a field programmable gate array.

Figure 3A:
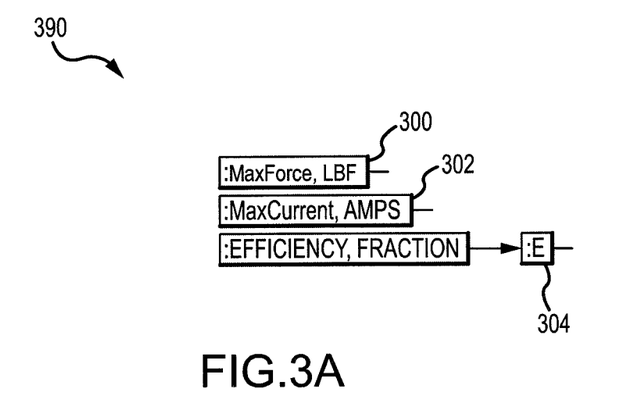
FIG. 3A illustrates input parameters to a force observer module, in accordance with various embodiments.

FIG. 3A illustrates input parameters 390 to force observer module 216. Input parameters 390 may be known parameters for the given motor and thus be predetermined. Input parameters 390 include a max force 300, which may be measured in pound force (lbf), newtons, or the like. Max force 300 represents the maximum force that can be applied by actuator 205. Another input is a max current 302, which may be measured in amps. Max current 302 represents the amount of current to be applied to actuator motor 206 to cause actuator 205 to apply the maximum amount of force. Another input is an efficiency fraction 304. Efficiency fraction 304 indicates the efficiency of the actuator. In the example illustrated in FIG. 3A, max force 300 is given to be 7,857 pounds, max current 302 is given to be 6.5 amps and efficiency fraction 304 is given to be 0.65.

Figure 3B:
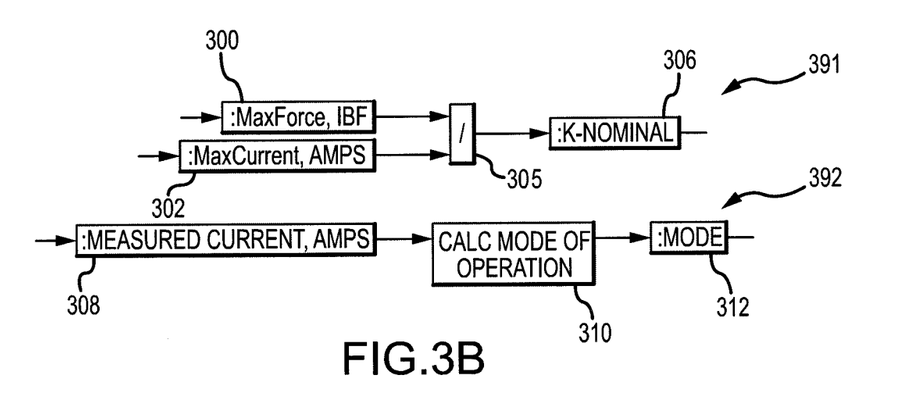
FIG. 3B illustrates a system for determining a constant K-nominal, in accordance with various embodiments.

FIG. 3B illustrates a system 391 for determining a constant K-nominal 306. K-nominal indicates a relationship between applied force and applied current for actuator 205, such that a current may be multiplied by K-nominal 306 to determine a force and a force can be divided by K-nominal 306 to determine a current. System 391 utilizes max force 300 and max current 302 as inputs. In block 305, the max force 300 is divided by the max current 302, resulting in K-nominal 306.

FIG. 3B also illustrates a system 392 for determining a mode of actuator 205 of FIG. 2. With brief reference to FIG. 4A, two plots are shown illustrating the relationship of force and current as current is applied to actuator 205 in accordance with various embodiments. Plot 400 illustrates the estimated force using the methods described herein and plot 402 illustrates the measured force. As illustrated, plot 400 includes a first part 404 corresponding to a first mode, a second part 406 corresponding to a second mode and a third part 408 corresponding to a third mode. In the first mode, the amount of current applied to actuator motor 206 is increasing and the force is increasing substantially proportionally. In the second mode, the amount of current applied to actuator motor 206 is decreasing a first amount. However, the force does not decrease significantly. In the second mode, the force remains substantially constant—it may be less than fifty percent (50%) as much per amp as the force decreases per amp while actuator 205 is operating in the third mode. This is a result of "stiction" (e.g., static friction) in actuator 205. In the third mode, once the "stiction" is overcome, the force is reduced substantially proportionally to the current as the current decreases a second amount.

Returning to FIG. 3B, system 392 is designed to determine in which mode actuator 205 is operating. The system 392 utilizes measured current 308 as an input. Measured current 308 may be provided by current sensor 208. Measured current 308 is applied to calculate mode of operation block 310, which generates mode 312 as an output. Mode 312 indicates the mode in which actuator 205 is operating.

Figure 3C:
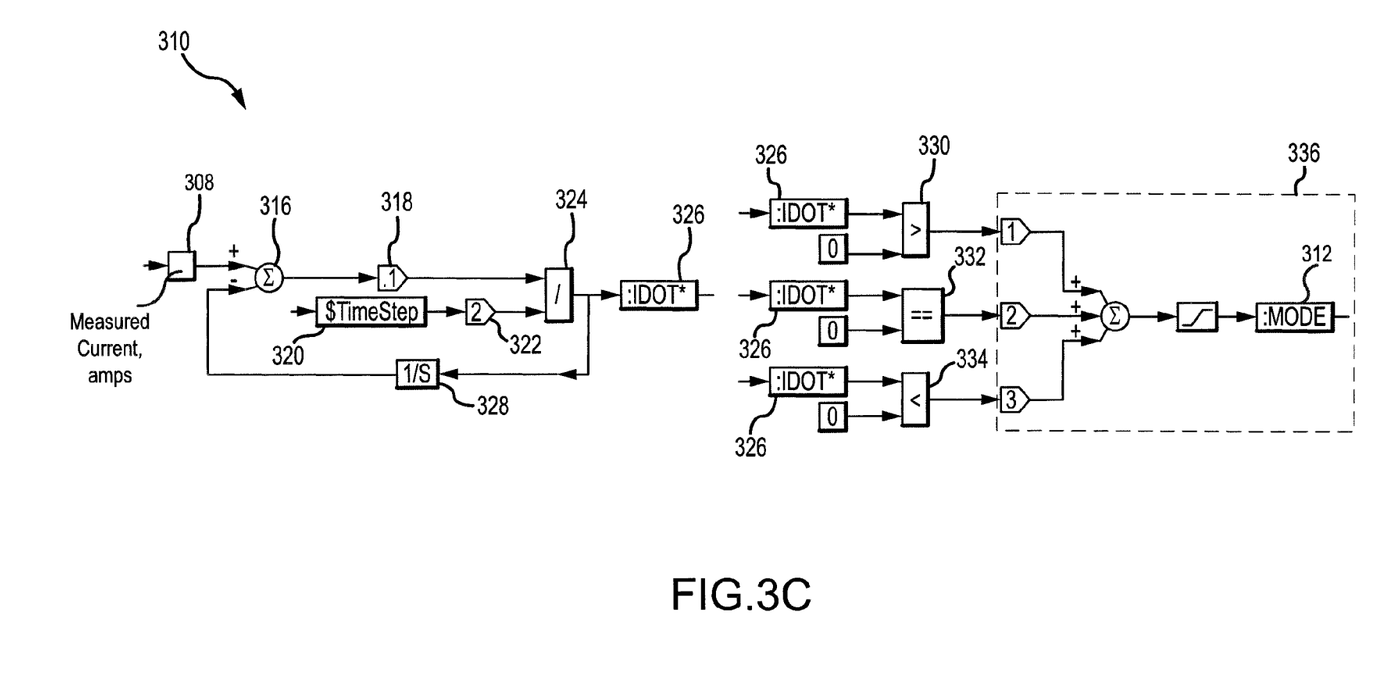
FIG. 3C illustrates logic for determining a mode of operation of an actuator, in accordance with various embodiments.

FIG. 3C illustrates the logic within calculate mode of operation block 310. As illustrated, measured current 308 is utilized as an input. The first portion of the calculate mode of operation block 310 is to calculate a filtered derivative of the current, or iDot 326. iDot 326 represents the estimated time rate of change of current. Blocks 316, 318, 324, 322, 320 and 328 represent a low pass filtered differentiator used to calculate iDot 326.

iDot 326 is then compared to zero in block 330, block 332 and block 334. If iDot 326 is greater than 0, then block 330 will output a 1, otherwise block 330 will output a 0. This 1 output corresponds to the first mode, indicating that the current is increasing and the force will increase proportionally to the current. If iDot 326 is equal to 0, then block 332 will output a 2. Otherwise, block 332 will output 0. This 2 output corresponds to the second mode, indicating that the force will not be greatly reduced as the current decreases. If iDot 326 is less than 0, then block 334 will output a 3. Otherwise, block 334 will output 0. The 3 output corresponds to the third mode, indicating that the force will be reduced substantially proportionately to the current as the current is reduced.

Block 336 receives the input from block 330, block 332 and block 334 and adds them together. The resulting sum indicates the mode 312. If the mode is equal to 1, then actuator 205 is in the first mode. If the mode is equal to 2, then actuator 205 is operating in the second mode. If the mode is equal to 3, then actuator 205 is operating in the third mode.

Figure 3D:
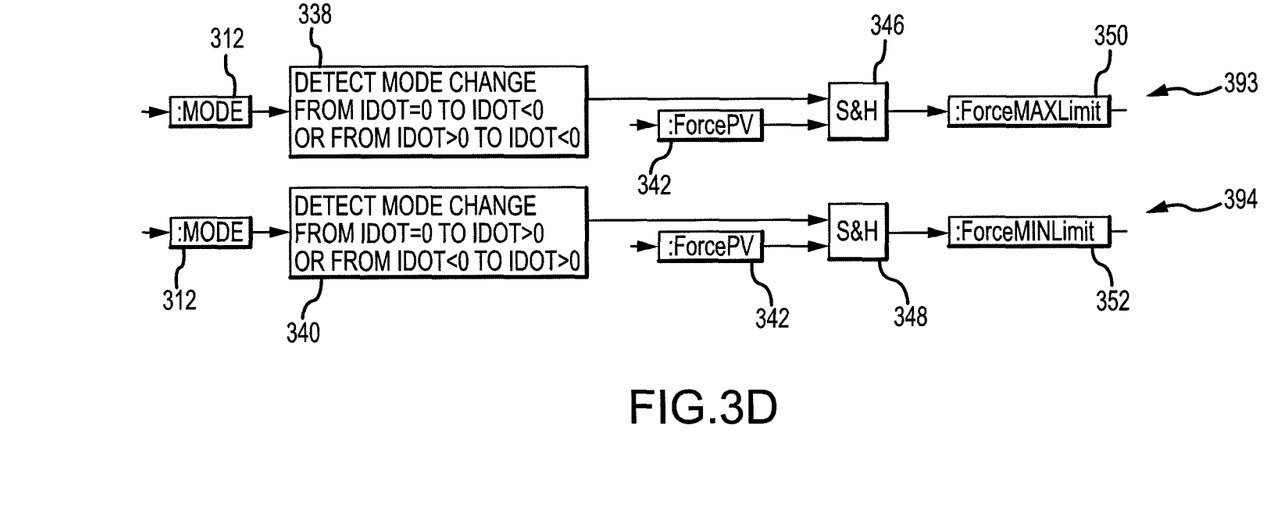
FIG. 3D illustrates a system for determining a variable ForceMaxLimit, in accordance with various embodiments.

FIG. 3D illustrates a system 393 for determining a variable ForceMaxLimit 350, indicating the maximum force applied during the most recent iteration of the first mode in accordance with various embodiments. ForceMaxLimit 350 will be used in the force estimation during the second mode. The input to system 393 is mode 312. In block 338, in response to the current beginning to decrease, a true signal will be generated. The true signal generated from block 338 will cause a sample and hold block 346 to become active. Sample and hold block 346 also receives a force previous value (ForcePV 342) signal. ForcePV 342 represents an estimated force that has been delayed. A unit delay block 367 in a system 395 of FIG. 3E receives the estimated force and provides the estimated force as ForcePV 342 after a predetermined delay.

When block 338 outputs a true signal, sample and hold block 346 will store and output ForcePV 342 until a new true signal is generated in block 338. Sample and hold block 346 will generate the stored ForcePV 342 as ForceMAXLimit 350. ForceMAXLimit 350 corresponds to the maximum estimated force during the first mode or the second mode.

FIG. 3D also illustrates a system 394 for calculating another variable, ForceMINLimit 352, indicating the minimum force applied during the most recent iteration of the third mode. ForceMINLimit 352 will be used in the force estimation during the second mode. Mode 312 is an input to system 394. In block 340, a true signal is generated in response to the current beginning to increase. Sample and hold block 348 also receives ForcePV 342. When the output from block 340 is true, ForcePV 342 will be stored in block 348, and block 348 will output the value as ForceMINLimit 352 until a new "true" signal is generated in block 340.

Figure 3E:
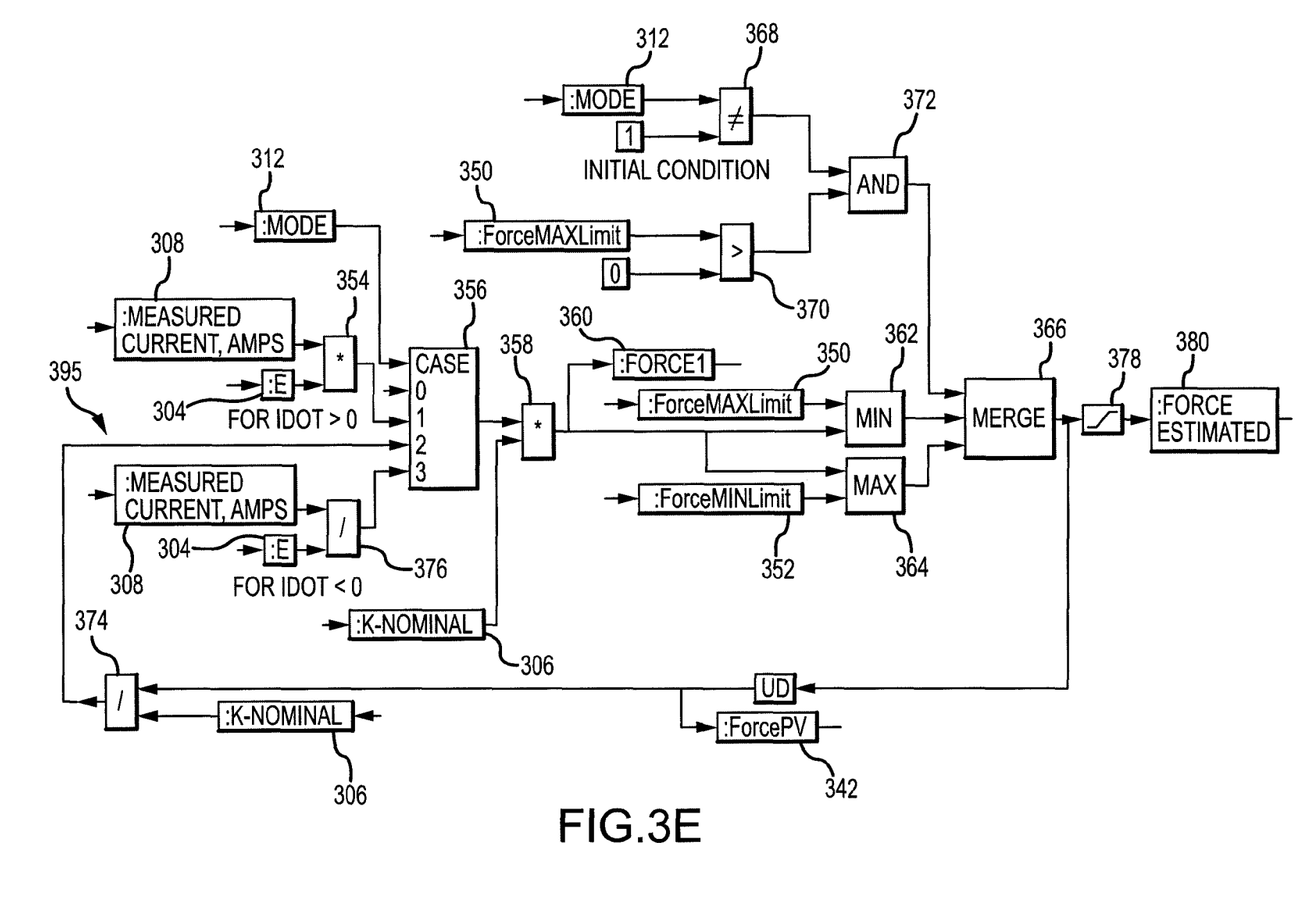
FIG. 3E illustrates a system that is used to calculate an estimated force, in accordance with various embodiments.

FIG. 3E illustrates a system 395 that is used to calculate an estimated force 380. Estimated force 380 may be provided as the output of force observer module 216 of FIG. 2.

Efficiency fraction 304 is a normalized value that ranges from 0 to 1. A value of one is ideal, meaning that actuator 205 is completely efficient and has no losses. With brief reference to FIG. 4A, the slope of first part 404 is equal to measured current 308 multiplied by efficiency fraction 304. The slope of third part 408 is equal to measured current 308 divided by efficiency fraction 304.

Returning to FIG. 3E, in block 354, measured current 308 is multiplied by efficiency fraction 304. The output of block 354 represents the relationship of the current and force measurements during the first mode. In block 376, measured current 308 is divided by efficiency fraction 304. The resulting value represents the relationship of the current and the force during the third mode.

Block 356 represents a case statement to be used for a selection of a relationship of the current and the force based on the mode. The mode 312 is provided as a selecting variable and the output of block 354 and block 376 are provided as selectable inputs. During the first mode (when mode=1), block 356 will output the output of block 354. During the third mode (when mode=3), block 356 will output the output of block 376. During the second mode (when mode=2), block 356 will output a value calculated elsewhere in system 395 (output of block 374).

In block 358, the output of block 356 is multiplied with K-nominal 306, the value calculated in system 391. When K-nominal is multiplied with the output of block 356, the resulting signal indicates a force value. The value of force is stored as force1 360.

Block 368 will output a true signal if mode 312 is not equal to 1. The logic in block 368 is used to initialize system 395.

Block 370 will output a true signal if ForceMAXLimit 350 is greater than 0. If block 370 and block 368 both output a true signal, then block 372 will output a true signal.

Block 362 compares ForceMAXLimit 350 and force1 360 and outputs the smaller of the two signal values. Block 364 compares force1 360 and ForceMINLimit 352 and outputs the larger of the two signal values.

While the output of block 372 is true, block 366 will output the signal generated in block 362. When the output of block 372 is false, block 366 will output the signal generated in block 364. The logic implemented in block 368, 370, 372, 362, 364 and 366 generates the estimated force when the mode is equal to 2.

Block 378 is a limiter, which prevents the output of block 366 from dropping below 0. The output of block 378 is estimated force 380, and may correspond to the output of force observer module 216.

The output of block 366 is driven through unit delay block 367, which delays the input signal (corresponding to the estimated force) by a predetermined period of time, such as one clock cycle, two clock cycles, 1 millisecond, etc. The output of block 367 is ForcePV 342, the previous value of the estimated force. In block 374, ForcePV 342 is divided by K-nominal 306.

The output of block 356 is multiplied by K-nominal 306 to result in a force value. Because ForcePV 342 is already a force value, it is divided by K-nominal 306 prior to entering case block 356 so that it can be converted back to a force value in block 358 via multiplication with K-nominal 306.

Figure 4A:
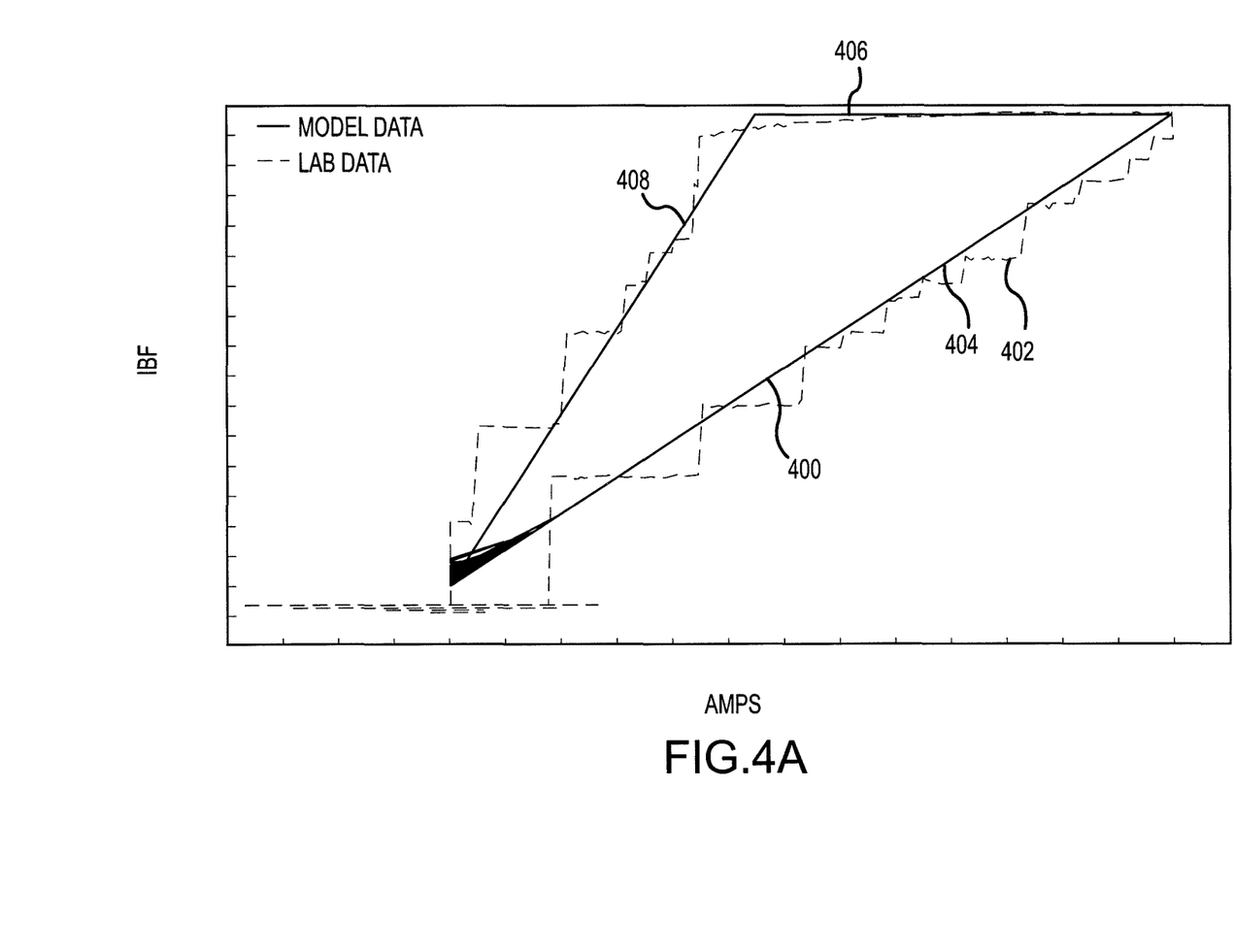
FIG. 4A illustrates a plot that represents a measured value of force applied by an actuator as a current is applied to an actuator motor and a plot that represents the estimated value of the force using the system of FIG. 3E, in accordance with various embodiments.

FIG. 4A illustrates plot 402 that represents a measured value of the force applied by actuator 205 as a current is applied to actuator motor 206 in accordance with various embodiments. Plot 400 represents the estimated value of the force using system 395. In FIG. 4A, up to 6.5 amps is applied to the actuator motor 206. As illustrated, the estimated force is similar to the measured force.

Figure 4B:
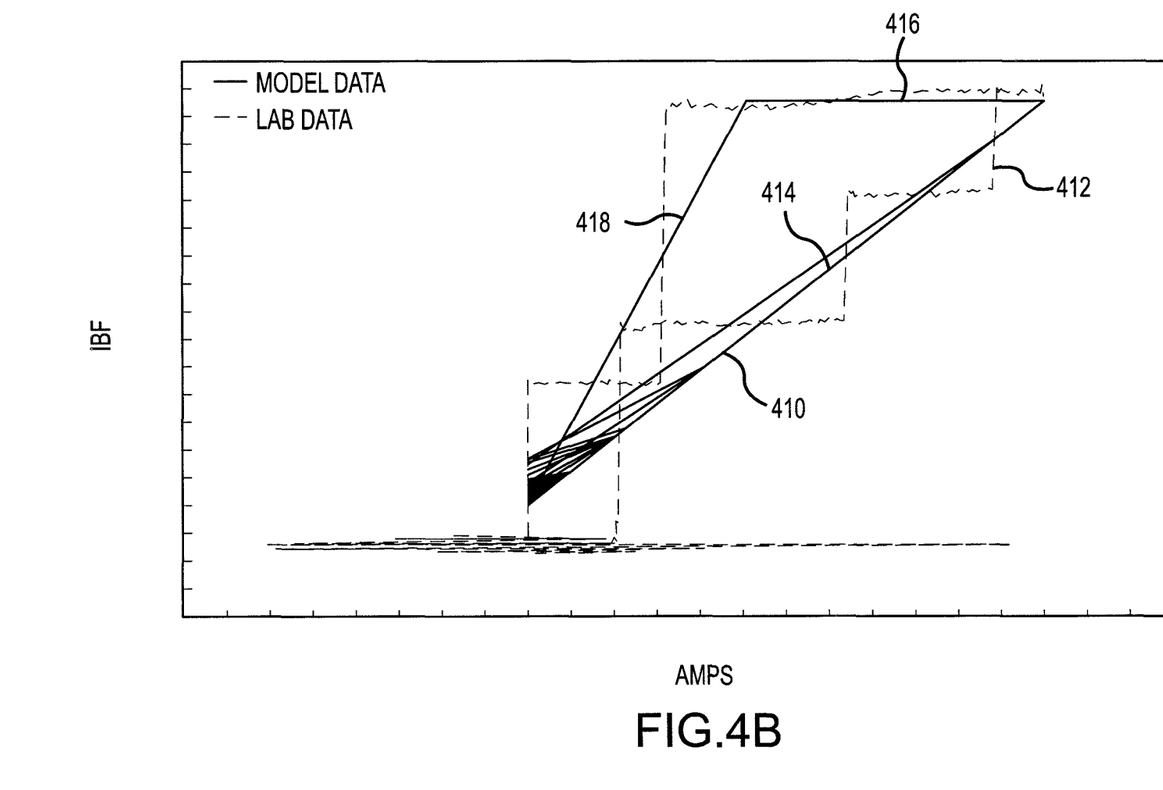
FIG. 4B illustrates another plot that represents a measured value of force applied by an actuator as a different current is applied to an actuator motor than in FIG. 4A and another plot that represents the estimated value of the force using the system of FIG. 3E, in accordance with various embodiments.

FIG. 4B illustrates a plot 412 that represents the measured force when a current up to 3 amps is applied to actuator motor 206. Plot 410 illustrates the estimated force using system 395. As illustrated, the estimated force is similar to the measured force during a first part 414 representing the first mode, a second part 416 representing the second mode and a third part 418 representing the third mode in accordance with various embodiments.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become lore pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods and apparatus are provided herein. In the detailed description herein, references to "one embodiment", "an embodiment", "various embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A system for determining a current amount of force applied to a disc brake system of an aircraft, the system comprising:
    an aircraft brake having a plurality of discs including an outer disc;
    an actuator configured to apply a force to the outer disc to compress the plurality of discs to reduce an angular velocity of wheels of the aircraft;
    a current sensor coupled to the actuator and configured to detect a detected amount of current applied to the actuator; and
    a controller coupled to the current sensor and configured to receive input parameters including a maximum force that can be applied by the actuator, a maximum current of the actuator that causes the actuator to apply the maximum force, and an efficiency fraction of the actuator that corresponds to an efficiency of the actuator and to determine an estimate of the current amount of force applied to the outer disc based on the detected amount of current and the input parameters.

2. The system of claim 1, wherein the controller is further configured to determine a constant K-Nominal that can be used to convert a force value into a current value or the current value into the force value by dividing the maximum force that can be applied by the actuator by the maximum current of the actuator.

3. The system of claim 1, wherein the actuator may operate in a first mode indicating that a force applied to the outer disc increases proportionally as an amount of current applied to the actuator increases, a second mode indicating that the force applied to the outer disc remains substantially constant as the amount of current applied to the actuator decreases a first amount and a third mode indicating that the force applied to the outer disc decreases proportionally as the amount of current applied to the actuator decreases a second amount.

4. The system of claim 3, wherein the controller is further configured to determine a filtered derivative of the detected amount of current and determine whether the actuator is operating in at least one of the first mode, the second mode or the third mode by comparing the filtered derivative with zero.

5. The system of claim 4, wherein the controller is further configured to select at least one of a first input in response to the actuator operating in the first mode, a second input in response to the actuator operating in the second mode or a third input in response to the actuator operating in the third mode.

6. The system of claim 5, wherein the controller is configured to determine the first input by multiplying the detected amount of current with the efficiency fraction, determine the second input by delaying the estimate of the current amount of force and dividing a delayed estimate of the current amount of force by a constant value and determine the third input by dividing the detected amount of current by the efficiency fraction.

7. The system of claim 5, wherein the controller is further configured to convert the selected input from a current value to a force value by multiplying the selected input by a constant value.

8. The system of claim 3, wherein the controller is further configured to determine a largest estimate of the force during a most recent iteration of the first mode and determine a smallest estimate of the force during a most recent iteration of the third mode.

9. The system of claim 8, wherein the controller is further configured to select a selected mode and, based on the selected mode, determine the estimate of the force by selecting at least one of a minimum of the largest estimate of the force during the most recent iteration of the first mode and a calculated force value or a maximum of the smallest estimate of the force during the most recent iteration of the third mode and the calculated force value.

10. A method for determining a force applied to an outer disc of an aircraft brake by an actuator, the method comprising:
receiving, at a controller of an aircraft and by a current sensor of the aircraft, a detected amount of current applied to the actuator;
receiving, at the controller, the detected amount of current and input parameters including a maximum force that can be applied by the actuator, a maximum current of the actuator that causes the actuator to apply the maximum force and an efficiency fraction of the actuator that corresponds to an efficiency of the actuator;
determining, by the controller, a mode of operation of the actuator including a first mode indicating that the force applied to the outer disc increases proportionally as an amount of current applied to the actuator increases, a second mode indicating that the force applied to the outer disc remains substantially constant as the amount of current applied to the actuator decreases a first amount and a third mode indicating that the force applied to the outer disc decreases proportionally as the amount of current applied to the actuator decreases a second amount; and
determining, by the controller, an estimated amount of force applied to the outer disc of the aircraft brake by the actuator based on the input parameters and the detected amount of current.

11. The method of claim 10, wherein determining the mode of operation includes determining, by the controller, a filtered derivative of the detected amount of current and comparing the filtered derivative with zero, such that the first mode is determined in response to the filtered derivative being greater than zero, the second mode is determined in response to the filtered derivative being equal to zero and the third mode is determined in response to the filtered derivative being less than zero.

12. The method of claim 10, further comprising determining, by the controller, a largest calculated force during a most recent iteration of the first mode and determining a smallest calculated force during a most recent iteration of the third mode.

13. The method of claim 12, further comprising determining, by the controller, a constant K-Nominal that can be used to convert a force value into a current value or the current value into the force value by dividing the maximum force that can be applied by the actuator by the maximum current of the actuator.

14. The method of claim 13, wherein determining the estimated amount of force applied to the outer disc of the aircraft brake by the actuator includes:
selecting, by the controller, at least one of a first input equal to the detected amount of current multiplied by the efficiency fraction in response to the first mode being determined, a second input being equal to a delayed value of the estimated amount of force divided by the constant K-Nominal in response to the second mode being determined or a third input equal to the detected amount of current divided by the efficiency fraction in response to the third mode being determined;
determining, by the controller, a value Force1 to be equal to the selected input multiplied by the constant K-Nominal; and
determining, by the controller, the estimated amount of force to be equal to at least one of a smaller value of the largest calculated force during the most recent iteration of the first mode and the value Force1 or a larger value of the smallest calculated force during the most recent iteration of the third mode and the value Force1 based on the mode of operation.

* * * * *